US011004532B2

(12) United States Patent
Weisickle et al.

(10) Patent No.: US 11,004,532 B2
(45) Date of Patent: May 11, 2021

(54) METHOD AND SYSTEM FOR ANALYZING TRAFFIC DATA

(71) Applicant: TELEDYNE LECROY, INC., Thousand Oaks, CA (US)

(72) Inventors: Robert L. Weisickle, Loomis, CA (US); Tom Nalepa, Loomis, CA (US); Aaron Masters, Loomis, CA (US)

(73) Assignee: TELEDYNE LECROY, INC., Thousand Oaks, CA (US)

(*) Notice: Subject to any disclaimer, the term of this patent is extended or adjusted under 35 U.S.C. 154(b) by 0 days.

(21) Appl. No.: 16/445,081

(22) Filed: Jun. 18, 2019

(65) Prior Publication Data
US 2019/0385691 A1    Dec. 19, 2019

Related U.S. Application Data

(60) Provisional application No. 62/686,230, filed on Jun. 18, 2018.

(51) Int. Cl.
*G11C 29/14* (2006.01)
*G11C 29/36* (2006.01)
*G06F 3/06* (2006.01)

(52) U.S. Cl.
CPC ........... *G11C 29/14* (2013.01); *G06F 3/0604* (2013.01); *G06F 3/0659* (2013.01); *G06F 3/0673* (2013.01); *G11C 29/36* (2013.01)

(58) Field of Classification Search
CPC .................................................. G06F 29/1104
USPC .......................................... 714/718, 720, 717
See application file for complete search history.

(56) References Cited

U.S. PATENT DOCUMENTS

| | | | |
|---|---|---|---|
| 7,805,706 B1* | 9/2010 | Ly | G06F 9/5083 717/121 |
| 2015/0350938 A1* | 12/2015 | Heikkila | H04L 43/50 370/252 |
| 2018/0115463 A1* | 4/2018 | Sinha | H04L 41/5067 |

* cited by examiner

*Primary Examiner* — Fritz Alphonse
(74) *Attorney, Agent, or Firm* — K&L Gates LLP

(57) ABSTRACT

The present disclosure relates to methods and apparatus for testing the true capabilities of devices connected to a computer. Methods consistent with the present disclosure may include generating test commands to send to a data storage device under test while storing information related to the commands sent to the data storage device in a low latency buffer. The low latency buffer may temporarily store command related data while data from a plurality of commands are organized and persistently stored in memory of a persistent data storage device. The low latency buffer may include or be comprised of high speed random access memory and the persistent data storage device may be a solid state drive or hard disk drive. Preferably, the persistent data storage device will store command test sequences that span long periods of time of hours or days.

20 Claims, 7 Drawing Sheets

METHOD AND SYSTEM FOR ANALYZING TRAFFIC DATA

CROSS-REFERENCE TO RELATED APPLICATIONS

The present disclosure claims the priority benefit of U.S. provisional patent application No. 62/686,230 filed Jun. 18, 2018, entitled "Method and System for Analyzing Traffic Data," the disclosure of which is incorporated herein by reference.

BACKGROUND OF THE INVENTION

Field of Invention

The present disclosure is generally related to the testing and evaluation of data storage devices. More specifically, the present disclosure is directed to providing command sequences to data storage devices in a manner that minimizes latency.

Description of the Related Art

Computer systems include various types of hardware devices and various different types of software. These different types of software include operating system software, platform layer software, application software, and device driver software that are commonly associated with different layers within a stack of software layers that are sometimes referred to respectively as an operating system layer, a platform layer, an application layer, and a device layer. Each of these successive layers are commonly given a priority where commands associated with the operating system may be given a first priority, commands associated with the platform layer may be given a second priority, commands associated with an application layer may be given a third priority, and command associated with accessing devices may be given a fourth priority. Furthermore, operations associated with accessing a device may require application software to communicate with the operating system software or with the platform software and may require the application software to pass commands through a device driver to computer hardware that communicates those commands to a device, such as a data storage device.

Because of these different layers of software and because of the different priorities given to each of these different respective layers, commands sent to a data storage device may incur delays that are not representative of capabilities of a data storage device. For example, in an instance when a disk drive is being tested, commands of a test program may not be sent to the disk drive as soon as a previous command has been completed as the transmission of this next command to the disk drive may have to wait for a processor to execute higher priory processes before a next disk drive test command is sent to the disk drive. These higher priority processes may also cause delays in data read from a disk drive. Furthermore, in instances when a computer system processing loads vary, processors may spend even more processing cycles executing instructions associated with higher priorities than at other times. Because of this, test programs designed to test devices, such as a disk drive, may not truly reflect actual capabilities of the disk drive and these test programs may not provide repeatable results as processing loads at a test computer vary.

What are needed to improve the accuracy and repeatability device testing are new methods and apparatus that provide test commands to such devices with minimal delays. Such methods and apparatus should allow evaluators to identify devices that provide the highest performance more easily.

SUMMARY OF THE CLAIMED INVENTION

The present disclosure relates to methods, non-transitory computer readable storage mediums, and apparatus that minimize latencies when testing devices. A method consistent with the present disclosure may sequentially generate commands to send to a device under test (DUT) such as a hard disk drive or solid state drive. Each of the sequentially generated commands may then be sent to the DUT and data that summarizes each of these commands may be stored in a low latency buffer. Next, methods consistent with the present disclosure may migrate at least a portion of the command summary data stored in the low latency buffer for storage in one or more logical blocs or sectors of a persistent data storage device.

When the presently claimed method is implemented by a non-transitory computer readable storage medium, a processor executing instructions out of a memory may perform steps consistent with the present disclosure. Here again the method may sequentially generate commands to send to a device under test (DUT) such as a hard disk drive or solid state drive. Each of the sequentially generated commands may then be sent to the DUT and data that summarizes each of these commands may be stored in a low latency buffer. Next, methods consistent with the present disclosure may migrate at least a portion of the command summary data stored in the low latency buffer for storage in one or more logical blocs or sectors of a persistent data storage device.

An apparatus consistent with the present disclosure may include a buffer that stores command summary data and may include a controller that implements a method consistent with the present disclosure. Here again the method may sequentially generate commands to send to a device under test (DUT) such as a hard disk drive or solid state drive. Each of the sequentially generated commands may then be sent to the DUT and data that summarizes each of these commands may be stored in a low latency buffer. Next, methods consistent with the present disclosure may migrate at least a portion of the command summary data stored in the low latency buffer for storage in one or more logical blocs or sectors of a persistent data storage device.

DETAILED DESCRIPTION

The present disclosure relates to methods and apparatus for testing the true capabilities of devices connected to a computer. Methods consistent with the present disclosure may include generating test commands to send to a data storage device under test while storing information related to the commands sent to the data storage device in a low latency buffer. The low latency buffer may temporarily store command related data while data from a plurality of commands are organized and persistently stored in a persistent data storage device. The low latency buffer may include or be comprised of high speed random access memory (RAM/DRAM) and the persistent data storage device may be a solid state drive (SSD) or hard disk drive (HDD). Preferably, the persistent data storage device will be a high speed solid state drive (SSD) that may include a low latency memory (e.g. FLASH memory) to store data used to store command test sequences that span long periods of time that can span hours or days. As such, methods and apparatus consistent with the present disclosure may store millions of commands that were part of a long test sequence. In certain instances, data stored in the persistent data storage device may consume multiple terrabytes of data that were collected over a span of hours or days when a single data storage device was tested.

In certain instances, apparatus consistent with the present disclosure may include hardware that sends a next command of a test sequence to device as soon as a previous command has completed. Data patterns written to or read from a data storage device under test may be identifiable by an identifier that could be as small as a first bits or bytes. Command data stored in the low latency buffer may include a command type, a data identifier, and a command time stamp for each command sent to the data storage device under test. Information stored in the low latency buffer may also include a command complete indicator and a command complete time stamp that identifies a time when a particular command was completed. In such instances, command duration times may be identified by subtracting a command complete time stamp from a command time stamp for each respective command of a plurality of commands.

Figure 1:
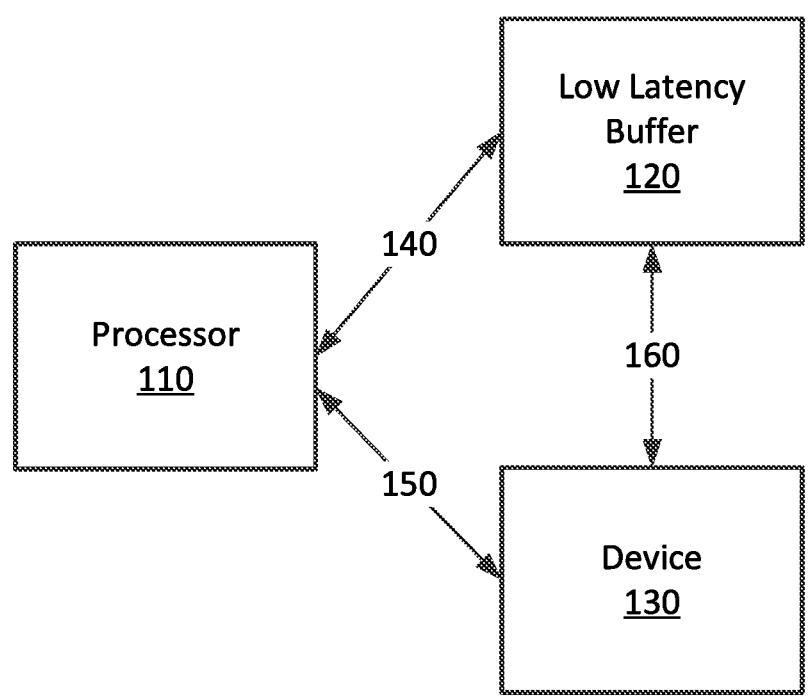
FIG. 1 illustrates a first architecture consistent with the present disclosure that allows a processor to access a low latency buffer when a hardware device is tested.

FIG. 1 illustrates a first architecture consistent with the present disclosure that allows a processor to access a low latency buffer when a hardware device is tested. FIG. 1 includes processor 110 that may access low latency buffer 120 and that may send commands to device 130. In certain instances, processor 110 may communicate with device 130 through a bridge device located between processor 110 and device 130. For example, a processor may send commands to a disk drive (e.g. an SSD or HDD) via a disk drive host bus adapter when the disk drive is being tested. In such an instance, the processor may communicate with the host bust adapter via a low latency bus such as the peripheral component interconnect express (PCIe) bus and the host bus adapter may communicate with the disk drive using a serial bus of a disk drive, such as a serial AT attachment (SATA) bus or serial attached small computer system interface (SAS) bus. Double arrowed lines 140, 150, and 160 of FIG. 1 are communications 140 that may be sent between a processor and a low latency buffer 120 and communications 150 that may be sent between the processor and device 130. Communications 140 between the processor and the low latency buffer 120 may be transferred using any communication bus known in the art and may include any of a portion of local system memory of the processor, a level 1 or level 2 cache memory of processor 110, or be a buffer accessible by via another low latency interface, such as a PCIe bus. When buffer 120 is connected to processor 110 and when processor 110 communicates with device 130 via a PCIe bus, two different PCIe busses may be used by the processor, one to communicate with low latency buffer 120 and another to communicate with device 130.

In certain instances, processor 110 could be a processor of a multi-processor system that may execute different sets of instructions that generate and send commands to device 130, that analyze stimulus and response data sent to and received from device 130, that store command data in the low latency buffer 120, and that organize data stored in buffer 120 when preparing to store test sequence command data at a high speed persistent data storage device (not illustrated in FIG. 1). Operations associated with other functions besides testing of device 130 may be performed by other processors of the multi-processor system. This may allow processor 110 to be dedicated to the generation and sending of commands to device 130 with minimal latency and could allow another processor of the multi-processor system to store command data in low latency buffer 120.

Communications 160 of FIG. 1 illustrate that communications may sent between buffer 120 and 130 directly, in certain instances such direct communications between low latency buffer 120 and device 130 may be implemented using a direct memory access (DMA) controller not illustrated in FIG. 1. As such, the apparatus of FIG. 1 may also include a direct memory access (DMA) controller not illustrated in FIG. 1. In such an instance, processor 110 may send commands to device 130 and processor 110 may allow the DMA controller to directly transfer write or read data between device 130 and low latency buffer 120 without processor 110 being involved in bulk data transfers to device 130. The use of a DMA controller could, thus, allow processor 110 to use most of its processing cycles to generating and issuing commands.

Figure 2:
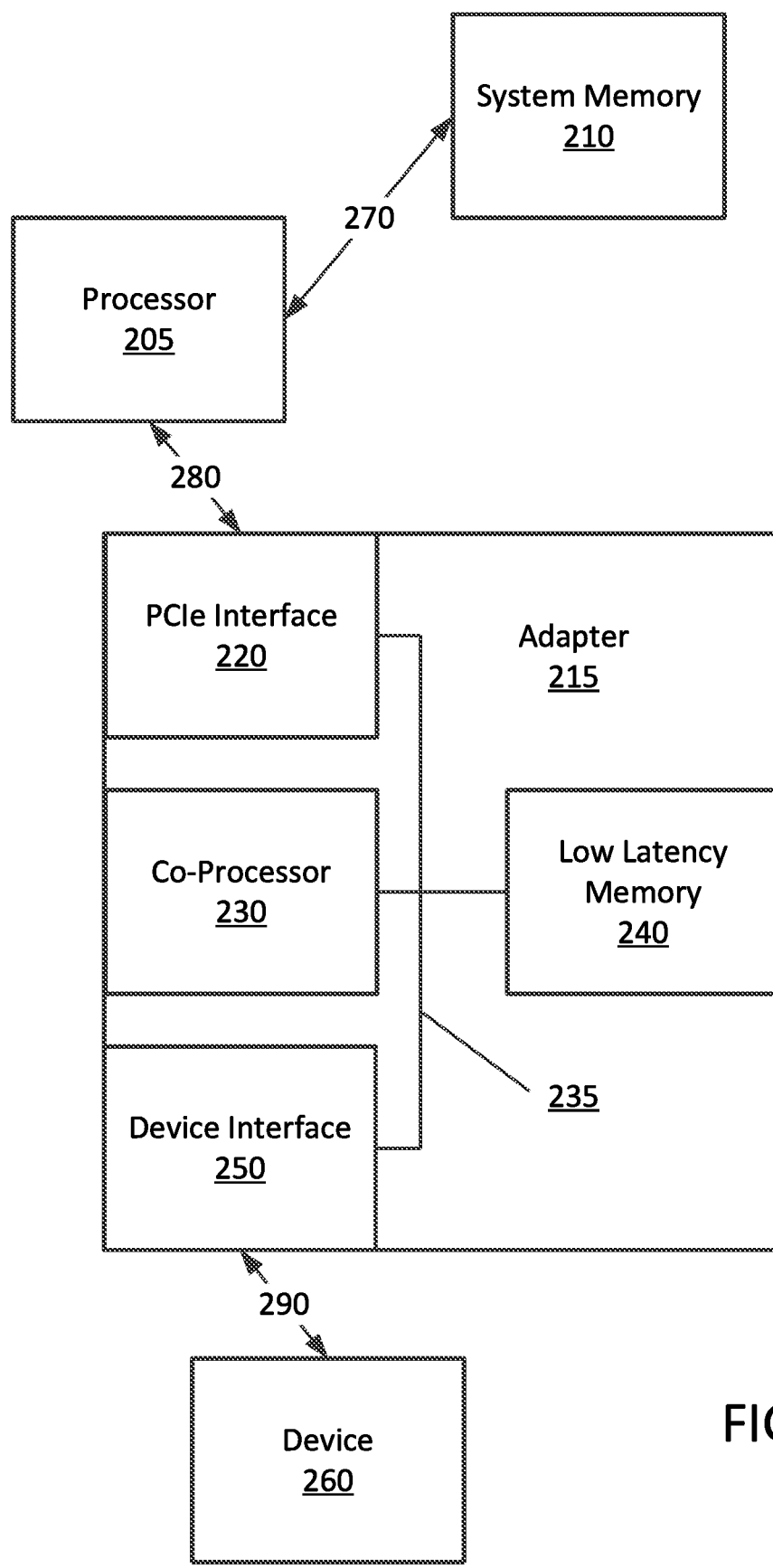
FIG. 2 illustrates a second architecture consistent with the present disclosure that may be used to test devices that can be connected to a computer system.

FIG. 2 illustrates a second architecture consistent with the present disclosure that may be used to test devices that can be connected to a computer system. FIG. 2 includes processor 205, system memory 210, adapter 215, and device 260. Adapter 215 of FIG. 2 includes PCIe interface 220, co-processor 230, low latency memory 240, and device interface 250. Double arrowed lines 270, 280, and 290 are communications 270 that may be sent between processor and system memory 210, communications 280 that may be sent between processor 205 and adapter 215, and communications 290 that may be sent between adapter 215 and device 260. Note that communications between processor 205 and adapter 215 are transferred through PCIe interface 220 and communications passed from adapter 215 to device 260 may be transferred through device interface 250.

Bus 235 located in adapter 215 may communicatively couple PCIe interface 220, co-processor 230, low latency memory 240, and device interface 250. In operation, processor 205 may access system memory 210 using communications 270, processor 205 may execute instructions out of memory 210 that cause processor 205 to provide generated test sequences to adapter 215 via communications 280 and PCIe interface 220. As commands are sent to device 260, co-processor 230 or another processor may analyze commands sent to and information received from device 260 when device 260 is tested. Co-processor 230 may sequentially send test commands to device 260 using communications 290. Bus 235 may be used to transfer data between PCIe interface 220, co-processor 230, low latency memory 240, and device interface 250 via bus 235. While a single communication bus 235 is illustrated in adapter 215, adapter 215 may include multiple different communication buses. For example, one communication bus could connect PCIe interface 220, co-processor 230, and device interface 250, and a second communication bus could connect co-processor 230 and low latency memory 240. Each of the components (220, 230, 240, & 250) included in adapter 215 can be optimized to testing device 260 such that test commands may be sent to device 260 with minimal latency.

Co-processor 230 or another processor could analyze commands and data sent to device 260 and may analyze information received from device 260. For example, co-processor 230 may generate and send a write command to device 260 and another processor included in adapter 215 could identify that the write command was sent to device 260. Information could be stored in low latency memory 240 that identifies that a write command of 10 logical blocks in length was sent to device 260 at time T1 that included a particular data pattern. After the write command and write data are sent to device 260, a processor at adapter 215 may identify that a command complete message was received from device 260 at time T2. Here again information identifying that a command complete message was received at time T2 may be stored in low latency memory 240.

While the use of a PCIe interface has been discussed above as being an interface that connects a processor to an adapter or test device, the scope of this disclosure is not limited to the use of a PCIe interface. Any standard interface or proprietary interface may be used to transfer commands to a device under test including, yet not limited to a non-volatile memory express (NVME), a Fibre Channel, a SATA, or a SAS interface.

Figure 3:
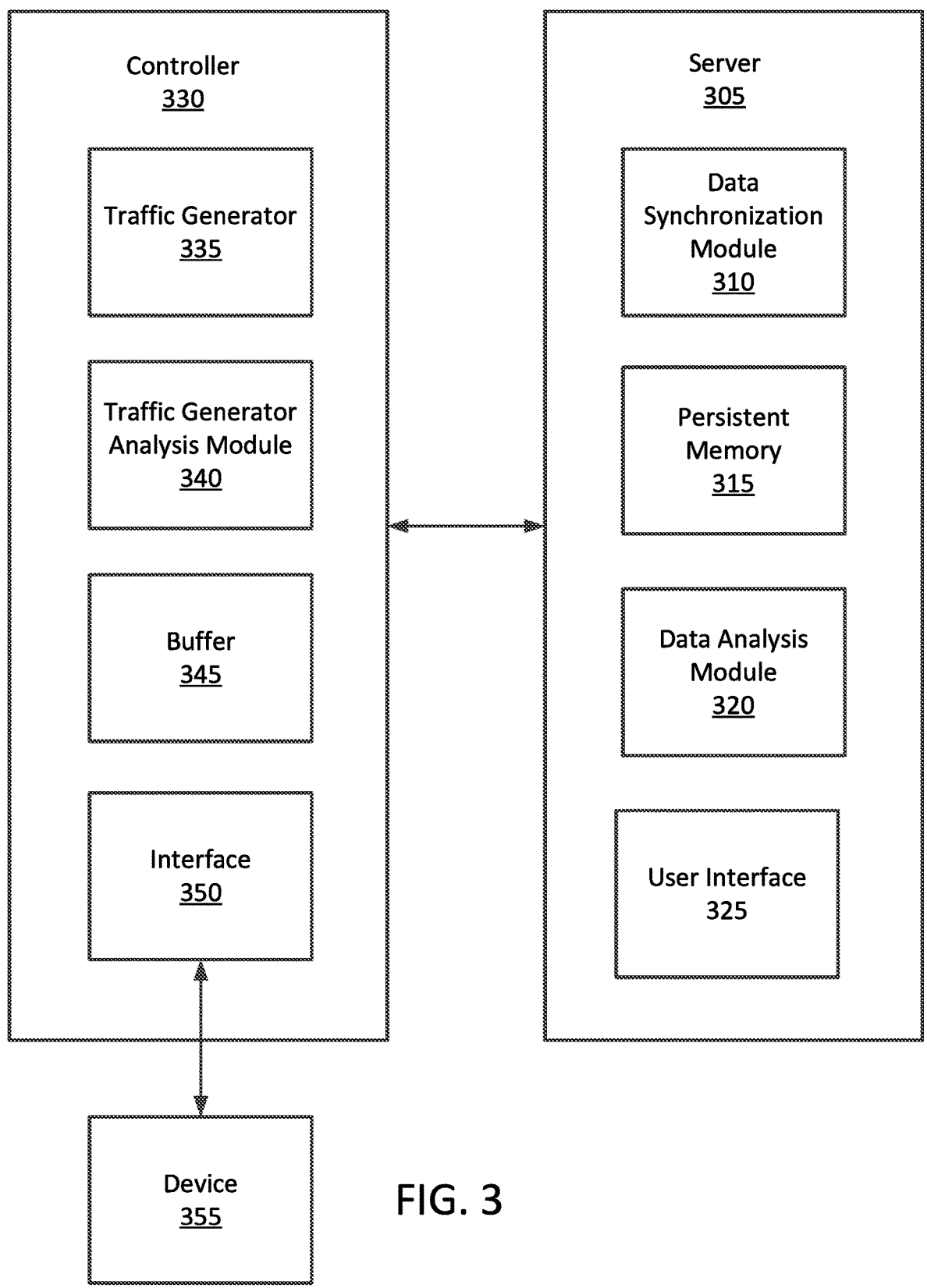
FIG. 3 illustrates a server that may be communicatively coupled to a controller when the server and the controller prepare to test a peripheral device, when test commands are sent to a peripheral device, and when test data is evaluated.

FIG. 3 illustrates a server that may be communicatively coupled to a controller when the server and the controller prepare to test a peripheral device, when test commands are sent to a peripheral device, and when test data is evaluated. FIG. 3 includes server 305, controller 330, and device 355. Server 305 includes data synchronization module 310, persistent memory 315, data analysis module 320, and user interface 325. Controller 330 includes traffic generator 335, traffic generator analysis module 340, buffer 345, and interface 350. Server 305 of FIG. 2 may include architectural elements of either of FIGS. 1-2 and controller 330 may include similar architectural elements of adapter 215 of FIG. 2. While traffic generator 335 and traffic generator analysis module 340 are illustrated as being part of controller 330, in certain instances, these functions may be performed by server 305.

Traffic generator 335 may be configured to generate or organize command sequences to send to device 355. As such, traffic generator 335 may generate commands that will be sent to device 355 via interface 350. In certain instances controller 330 may include a processor that executes instructions out of a memory when device 355 is tested. Alternatively or additionally controller 330 may include a field programmable gate array (FPGA), an application specific integrated circuit (ASIC), or other digital logic. Logic or processors of controller 330 may control the timing of commands sent to device 355 as device 355 is tested.

In order to operate at hardware speeds, hardware digital logic implemented by discrete logic, logic of an FPGA, or logic of an ASIC. Such logic may be used to generate data or provide data sent in write commands to device 355. In certain instances, such logic may be used to identify that a data pattern read from device 355 corresponds to a known data pattern that may be identified using a data pattern identifier. This logic could allow a memory to be loaded with write data to be sent to device 355 in a manner that helps minimize an amount of memory that is required to implement buffer 345. The functions of generating write data an interpreting read data may alternatively or additionally include a processor executing instructions to generate write data or interpret read data. Alternatively or additionally, hardware logic may perform certain functions at controller 330 and a processor executing instructions out of a memory may perform other functions at controller 330.

In one instance traffic generator 335 identify a write command that spans multiple sectors or logical blocks. Traffic generator 335 may also identify different data patterns that should be written to different logical blocks (or sectors) of device 355. Traffic generator 335 may store a write command of a number of blocks in buffer 345 and may generate data that to write to device 355 from one or more shorthand codes. In certain instances traffic generator 335 may store an entire test sequence using shorthand notation in a memory other than buffer 345 and buffer 345 may be loaded with write commands and write data as traffic generator 335 loads command information and generated data into buffer 345.

Operations of the traffic generator analysis module 340 and possibly the traffic generator module 335 may perform functions associated with read commands and may analyze read data received from device 355. In such an instance, a read command may be sent to device 355 and read data received from device 355 may be analyzed by traffic generator analysis module 340. This analysis may match data stored in each respective logical block to a shorthand notation that identifies specific sets of data patterns for each of the respective logical blocks. The traffic analysis generator module 340 may then store this shorthand notation and/or command information in buffer 345. In certain instances, a data pattern written to a particular logical block/sector may include a data pattern identifier and this data pattern identifier may be used to identify a specific data pattern written to a particular logical block/sector. Such a data pattern identifier may identify a data pattern using a few bits, a byte, or more than a byte of information. As such, traffic generator analysis module 340 may parse data written to or read from logical block ABC of device 355 to identify a data pattern identifier that is included in the data written to or read from logical block ABC of device 355.

An example of a shorthand notation that identifies specific sets of respective data patterns uses eight bits (or one byte) to represent specific data patterns. Since eight bits (one byte) can represent up to 256 different numbers, each of these 256 different numbers can identify a single set of data patterns that may each include 512 bytes. Since data storage devices like disk drives and solid state disk drives (SSDs) commonly store 512 bytes of data in each sector or logical block, representing data patterns using one bytes (or eight bits) using this shorthand notation would reduce an amount of data stored in buffer 345 by a factor of nearly 512 times based on the equation: Reduction Factor=512/(number of shorthand bits)=512/1=512 in this example. Such an implementation would allow a buffer to store a different data pattern for each sector of logical block of a data storage device. Program code or digital logic implementing functions of traffic generator 335 could allow traffic generator 335 to identify a data pattern for a given write command and traffic generator 335 could generate a data pattern to provide to device 355 for that given write command. Similarly, program code or digital logic implementing functions of traffic generator analysis module may receive data read from device 355 when mapping the read data to one of the 256 data patterns and this analysis could cause controller 330 to store a shorthand notation of that read data in buffer 345 or in another memory.

Controller 330 may also include timers capable of timing events or tracking the timing of events. This tracking may be performed at least in part by traffic generator analysis module 340. Traffic generator 335 may also identify data related to commands that may include a first relative time stamp, an input/output (I/O) size (that may correspond to a number of logical blocks spanned by a read or write command), and an I/O completion time (or command duration), and data patterns sent or received in respective write and read commands. Information that identifies data patterns may identify pattern sequences using a shorthand notation. A set of selected data patterns may be identified by data stored in a number of bits.

In instances where device 355 is a data storage device (e.g. a SSD or HDD) that stores 512 bytes of data per logical block (or sector) and where a number of data patterns used to test device 355 are limited to 256 different data patterns an amount of memory required to store these data patterns would be equal to (256 patterns)×(512 bytes/pattern)=135,680 bytes (or 135.68 kilobytes). Since this is a relatively small, an amount of memory, buffer 345 could be used to store each of the 256 different data patterns in buffer 345 or this data could be stored in another memory. In such an instance, information associated with a write command could identify a particular pattern by identifying a starting memory address of the buffer or memory where this data is stored. As such, a data pattern could be identified by a single pointer or by a starting location and an offset. In such instances, traffic generator 335 would not have to generate a pattern based on a pattern identifier. Instead, traffic generator 335 could access data stored at an offset address at buffer 345 that data could be used during a write command. Alternatively, during execution of a read command, traffic analysis module 340 could identify patterns received from device 355 by comparing information stored in the buffer or memory to data read from device 355. Alternatively, data patterns read from a logical block may be identified by an identifier that is included in in a first byte or two of that logical block, for example.

In certain instances, methods consistent with the present disclosure could store timing data using standard notation or this timing data could be stored using scientific notation. In an instance where standard notation is used, times from one nanosecond to about 4 seconds could be represented in four bytes of information. If however, two bytes were used to represent a time using scientific notation, these two bytes could store time information more efficiently by storing a number and an exponent. For example, if a number stored in a first byte of these two bytes corresponded to the decimal number 1 and exponent information stored in the second byte of these two bytes corresponded to an exponent of $1 \times 10^{-6}$ the stored timing data would correspond to $1 \times 1 \times 10^{-6}$ seconds (or 1 microsecond). In either instance a number of bytes could be allocated to an expected command duration time and another set of bytes could be allocated to an actual command duration time according to preferences of the designer.

Methods consistent with the present disclosure may allocate some number of (#) bytes according to allocation schema that includes a series of fields where a total number of (#) bytes would be allocated to summarize data associated with a command. In such an instance, a first field of this series of fields could identify a command type, a second field could identify a starting logical block, a third field could identify a number of logical blocks (or sectors) that the command includes, a fourth field could identify an expected command duration time, a fifth field could identify data patterns, and a sixth field could identify a measured command duration time. In such an instance the total number of (#) bytes associated with a command by the formula T=(# bytes in 1st field)+(# bytes in 1st field) (# bytes in 1st field)+(# bytes in 2nd field)+(# bytes in 3rd field)+(# bytes in 4th field)+(# bytes in 5th field)+(# bytes in 6th field).

In an instance where one byte is used to represent a command type, five bytes are used to represent a starting logical block, one byte is used to represent the number of logical blocks included in the command, four bytes are used to represent an expected command duration time, one byte is allocated for a data pattern, and four bytes are allocated to represent an actual command duration time, the total number of bytes required to represent a command data could be represented by data stored in just 16 bytes (1+5+1+4+1+4=16) as shown in table 1 below:

TABLE 1

Total Number of Bytes to Allocate to a Command

| Field | Bytes Allocated |
|---|---|
| Command Type | 1 |
| Starting Logical Block | 5 |
| Number of Logical Blocks Accessed by Command | 1 |
| Expected Command Duration Time | 4 |
| Data Pattern | 1 |
| Actual Command Duration Time | 4 |
| Total # Bytes/Command | 16 |

If a first portion of a test sequence included one million commands, the entire one million command sequence could be stored in a buffer that was 16 Megabytes in size. Before this entire buffer was filled, a processor could organize data stored in the buffer when preparing that data to be stored in a persistent memory, such as persistent memory 315 of FIG. 3. Here again this persistent memory could be either a HDD or SSD drive. In such instances, data synchronization module 310 may organize and store summarized command information in persistent memory 315 before buffer 345 is filled with data. Such an approach allows apparatus consistent with the present disclosure to store command sequences in a persistent memory that span long lengths of time (e.g. hours or days).

Because of this, methods and apparatus consistent with the present disclosure may efficiently store command sequence information even in instances where additional bytes were allocated to store command related information. For example, data pattern information could identify several different data patterns. In one instance these different data patterns could be identified by storing multiple discrete data pattern identifiers in the buffer. Alternatively, data patterns could be identified according to a schema where a first byte of two data pattern bytes could identify an initial data pattern and a second byte of the data pattern byte could identify an offset number. In this instance a first data pattern may correspond to pattern number 10 and an offset could correspond to the number 2, this could cause a three logical block write command to write data pattern 10 to a first logical block, to write data pattern 12 to a second logical block, and to write data pattern 14 to a third logical block of the three logical block write command. Alternatively, each logical block written using a write command that spans multiple logical block could be written using a same data pattern.

Once the traffic generator has generates a command, this command may be sent to device 355 via interface 350. In an instance where the first command is a write command, data patterns sent to write to device 355 could be provided by traffic generator 335 when data associated with the write command is provided to device 355. As soon as the write command has been sent to device 355, a timer at controller 330 may be started and after controller 330 receives an indication from device 355 that the write command has completed, the timer may be stopped. Since the timer was started at the beginning of the command and since the timer was stopped at the end of the command, the actual command duration time may be identified using this timing information. At this point in time, traffic analysis module may write the actual timing data into buffer 345 at a location that corresponds to the actual command duration time for this particular command. Alternatively, a time (e.g. T1) associated with the sending of the write command may be stored in buffer 345 and a time (e.g. T2) associated with the completion of that write command may be stored in buffer 345 and a command duration may be identified later by data analysis module 320 by the formula Command Duration Time=T2−T1.

Next a read command may be sent to device 355 via interface 350 after which interface 350 may receive read data from device 355. When received, this read data could be stored in a portion of buffer 345 until traffic analyzer 340 analyzed this data pattern. Traffic analyzer 340 may then identify that data pattern corresponds to a data pattern of the data patters identifiable using the shorthand notation or an identifier included in the read data. The traffic analysis module 355 could then write the identified data pattern using the shorthand notation or identifier into appropriate locations of buffer 345.

When data patterns are identified according to shorthand pattern identifiers, buffer 345 can store information that represents data written to and read from various logical blocks of device 355 in a manner that allows buffer 345 remain relatively small as compared to a buffer that attempted to store all of the bytes written to or read from device 355. As a test is being executed or after a test has been completed, controller 330 may provide test traffic data to server 305 such that a very long test sequence can be stored in persistent memory 315. Furthermore, data analysis module 320 may perform additional analysis on the persistently stored test data. After this additional analysis is performed results of this analysis may be displayed on a display associated with user interface 325. In certain instances, user interface 325 may be a graphical user interface (GUI) that may also receive instructions from a user.

Once a test sequence has been stored, that test sequence may be replayed any number of times and test data traffic may be provided to server 305 after each of these replays. Data analysis module 320 may then perform additional analysis that may show variances or inconsistencies in the test data traffic from one replay to another. In certain instances, a user may enter instructions into user interface 325 that identifies a number of times that a particular test sequence should be replayed.

Test sequences stored in buffer 345 may also be provided to server 305 for storage in persistent memory 315 or in another memory at server 305. Because of this, any previously generated test sequence could be moved back to buffer 345 and be run again. In certain instances, user interface 325 may receive commands that cause a particular test sequence to be persistently stored, to be moved from buffer 345 to memory 315, or be moved from memory 315 to buffer 345. Alternatively, a user may provide test sequence information via user interface 325 that could be shared with controller 330 and this user provided test sequence information could be used by traffic generator 335 when a test sequence that is based on the user input is stored in buffer 345.

In yet other instances, test sequences could be generated from activity collected using a bus analyzer that captures commands sent to a data storage device. In such instances, sets of commands executed by application or other programs may be converted into test sequences that may be replayed and repetitively sent to a data storage device.

In certain embodiments, operations of controller 305 may be tightly coupled to operations of server 305 such that entire sets of actual data written to device 355 or data read from device 355 pass through buffer 345. In such instances, controller 330 may provide data to server 305 as or immediately after it has been passed to or received from device 355. In such instances, server 305 could provide a next command to controller 335 that could be stored in buffer 350. In other instances, server 305 may provide all command and write data to controller 330 over time and controller 330 could provide read data from device 355 to server 305 via buffer 345.

Figure 4:
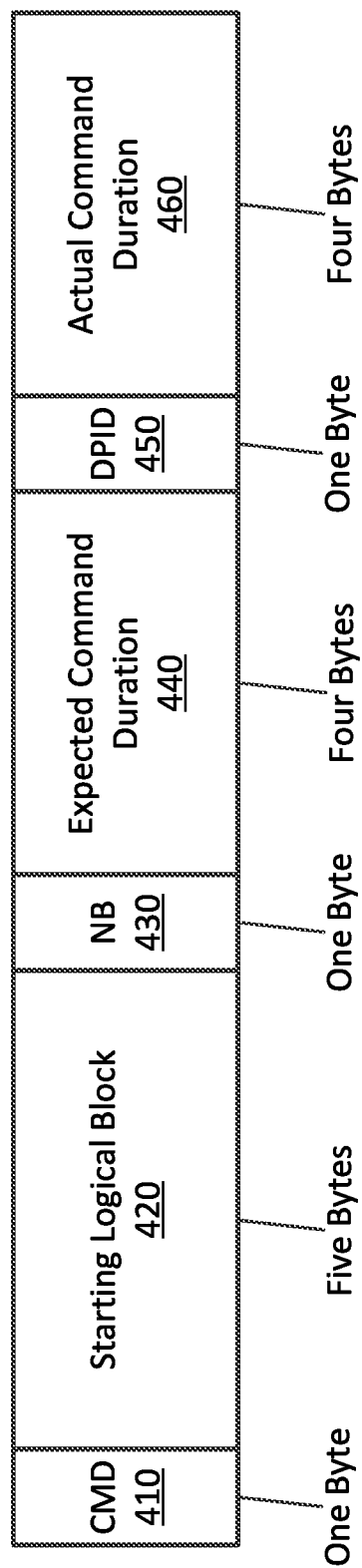
FIG. 4 illustrates a set of command information may be stored in allocated portions of a buffer memory that may be used to provide commands to a device that is being tested.

FIG. 4 illustrates a set of command information may be stored in allocated portions of a buffer memory that may be used to provide commands to a device that is being tested. FIG. 4 illustrates that command (CMD) 410 may be stored in one byte of the buffer, illustrates that five bytes have been allocated from the buffer to store a starting logical block 420 number, and that a number of blocks (NB) 430 indicator may be stored in a one byte of the buffer. FIG. 4 also illustrates that four bytes have been allocated in the buffer to store an expected command duration 440 time, that one byte has been allocated in the buffer to store a data pattern identifier (DPID) 450, and that four bytes have been allocated in the buffer to store an actual command duration 460 time. The command data illustrated in FIG. 4 may be representative of various different type of commands (e.g. a read command or a write command) that may be sent to a device that is being tested. Starting logical block 420 may identify a starting location where a read or write operation will begin and the number of blocks 430 may identify that command 410 will span some number of logical blocks.

As mentioned in respect to FIG. 3 data pattern identifiers, such as DPID 450 may be used to identify data that should be used in a write command or that was identified from data read from a test device. Actual command duration 460 timing information or read data identifiers may be stored in the buffer after read data has been received or after a command has been completed.

Figure 5:
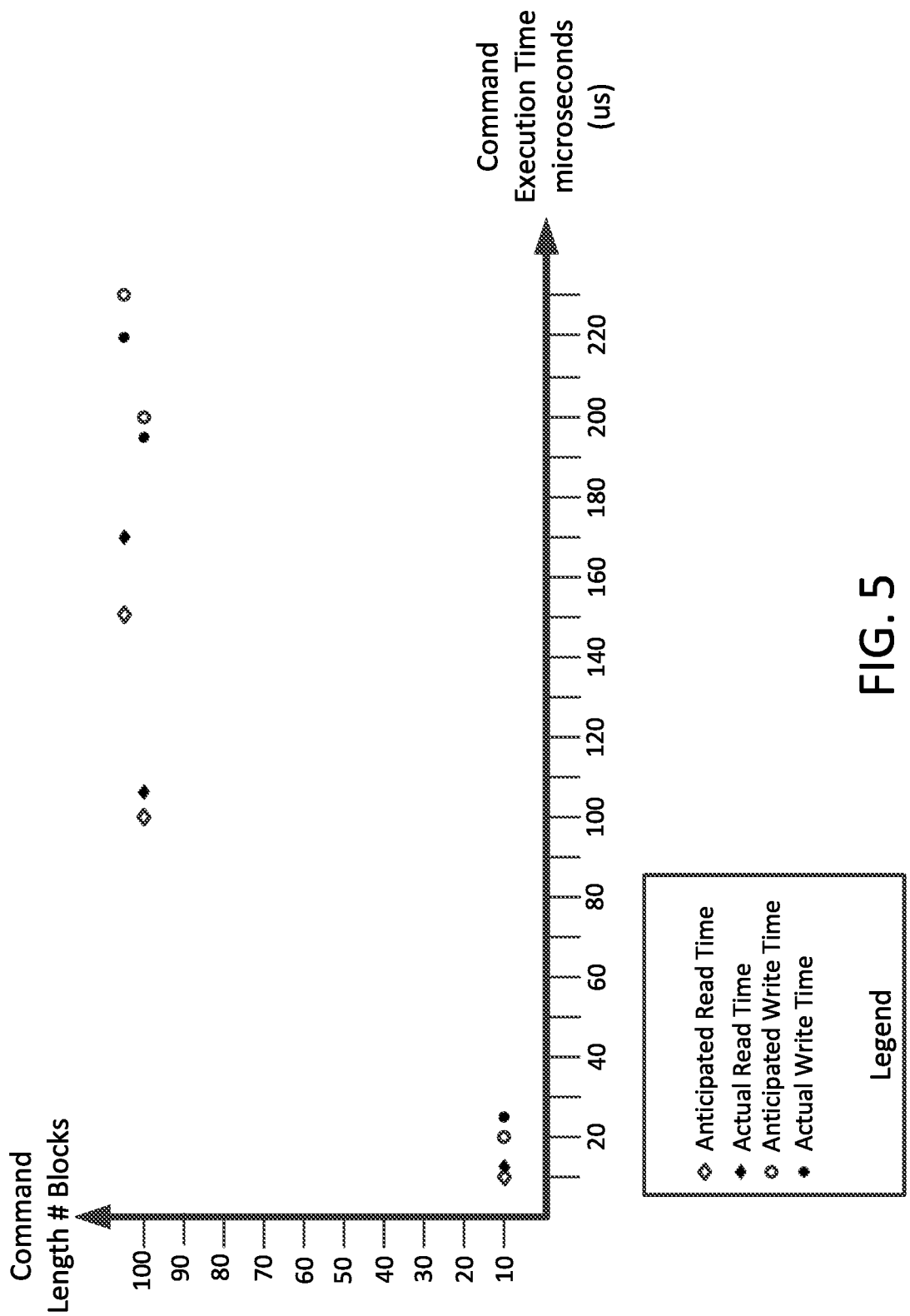
FIG. 5 illustrates the data included in table 2 when displayed in a graphical format.

Table 2 illustrates a set of data that may be provided for analysis and from which graphical information may be generated and displayed for review. Note that the commands illustrated in table 2 include a series of write commands that may have sent to a solid state disk (SSD) drive when that device was tested followed by a series of read commands that were sent to the SSD drive. Note that the three write commands wrote data starting specific logical block locations that spanned respectively 1, 100, and 105 logical block(s). Note that these numbers of blocks correspond to a command length. Table 2 also stores expected command duration times (in microseconds) for each of these write commands and include a field where an actual amount of time (actual command duration) that these commands took to execute can be stored. Read commands included in table 2 include a same set of starting logical block locations and command lengths. Table 2 also identifies expected command duration times and actual command duration times for each of these read commands. Note that some of the commands in table 2 took less time to complete than expected and other commands took greater amounts of time to complete than expected. Note also that expected write times are longer than expected read times. In certain instances, such differences in expectations may be related to the physics of a device. For example, in certain instances, it may take longer to write to a location at an SSD drive than it does to read from that same location. In certain instances, SSD write times can be much longer than SSD read times, especially in instances when the memory cells of an SSD drive must be erased before they are re-written. Data stored in table 2 may be analyzed by software, such as data analysis module 320 of FIG. 3. After such data has been analyzed it may be presented in a graphical format in a user interface. An example of such a graphical presentation of data is illustrated in FIG. 5.

TABLE 2

Command Analysis Data

| Command | Starting Logical Block | Command Length in Blocks | Expected Command Duration | Actual Command Duration |
|---|---|---|---|---|
| Write | 100 | 10 | 20 us | 25 us |
| Write | 101 | 100 | 200 us | 195 us |
| Write | 1000 | 105 | 230 us | 220 us |
| Read | 100 | 10 | 10 us | 11 us |
| Read | 101 | 100 | 100 us | 105 us |
| Read | 1000 | 105 | 150 us | 170 us |

FIG. 5 illustrates the data included in table 2 when displayed in a graphical format. FIG. 5 includes a vertical axis that identifies a command length measured by a number of logical blocks that the command spans. FIG. 5 includes a horizontal axis that identifies command execution time in microseconds (us). FIG. 5 also includes a legend that identifies that triangular shaped data points with a white center are anticipated read times, that solid black triangular shaped data points are actual read times, that circular shaped data points with a white center are anticipated write times, and that solid black circular shaped data points are actual write times. FIG. 5 also includes a series of triangular and circular shaped data points that correspond to data included in table 2. Since some of the data points in FIG. 5 a sold black and others have white centers, the data illustrated in FIG. 5 graphically illustrates amounts of time different commands were anticipated to take and amounts of times that those commands actually took to execute. FIG. 5, thus, illustrates that data collected using tests methods and apparatus consistent with the present disclosure may be analyzed and displayed in a graphical format on a display for a user to review.

Figure 6:
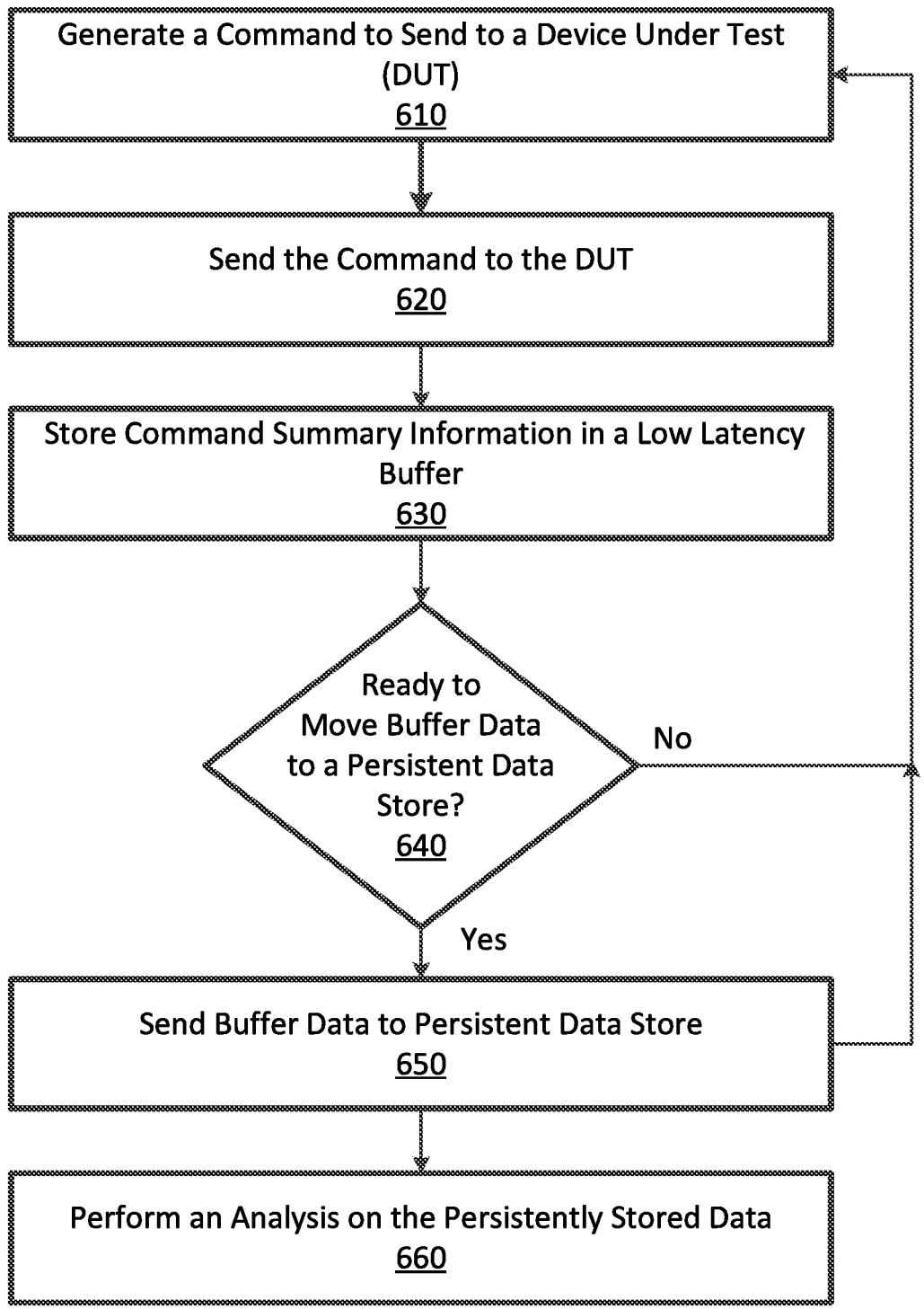
FIG. 6 illustrates a series of steps that may be performed to generate commands to send to a device under test and that may store test command summary information

FIG. 6 illustrates a series of steps that may be performed to generate commands to send to a device under test and that may store test command summary information. FIG. 6 begins with step 610 where a command may be generated to send to a device under test (DUT). In step 620 of FIG. 6 the command generated in step 610 may be sent to the DUT. Next in step 630 command summary information may be stored in a low latency buffer, such as the low latency buffer or memory illustrated in FIGS. 1-3. After step 630, determination step 640 may identify whether at least a portion of the command data stored in the buffer is ready to be transferred to a persistent data store, when no program flow may move back to step 610 where another command is prepared to be sent to the DUT.

When determination step 640 identifies that at least some of the data stored in the buffer is ready to be moved to the persistent data store, program flow may move to step 650 where at least some of the data stored in the buffer is moved or sent to the persistent data store. After step 650 program flow may move back to step 610 where another command to send to the DUT is generated. Alternatively program flow may move from step 650 to step 610 of FIG. 6 where an analysis may be performed on the persistently stored test data in step 660 of FIG. 6.

The steps illustrated in FIG. 6 may be performed by processors of a multi-processor system, where certain functions may be performed by one processor and other functions may be performed by a second or a third processor of the multi-processor system. In such instances, a first processor may generated test commands, a second processor may analyze test command data sent to and received from the DUT and store this test data in a low latency buffer, and a third processor may send the test data stored in the buffer to either the persistent data store or to a device that organizes this test data for storage in the persistent data store.

Apparatus and methods consistent with the present disclosure may store test data in logical blocks at the persistent data storage device over long spans of time, where each logical block may store data that summarizes dozens of commands that were sent to a DUT. Here again the persistent data store may be or include a hard disk drive (HDD) or a solid state drive (SSD) and the device under test may also be an HDD or an SSD.

In certain instances, test sequences stored in the persistent memory may be replayed discussed in respect to FIG. 3 of this disclosure and this data may be analyzed when generating graphical representations of data begin generated as discussed in respect to FIG. 5 of this disclosure. Methods and apparatus consistent with the present disclosure may utilize a disk drive or an SSD-type storage that provides an improved means of debugging storage traffic issues by capturing a very large quantity of the traffic data. Further, the system may support multiple storage modes, such as a performance mode where only input/output (I/O) metadata is stored as well as a full capture mode that captures I/O meta data as well as read/write data. Further, the system may provide a built-in performance analysis capability along with a way to export and replay captured analyzer traces (i.e., traffic data). Thus, the system is highly efficient, and easy to execute.

Figure 7:
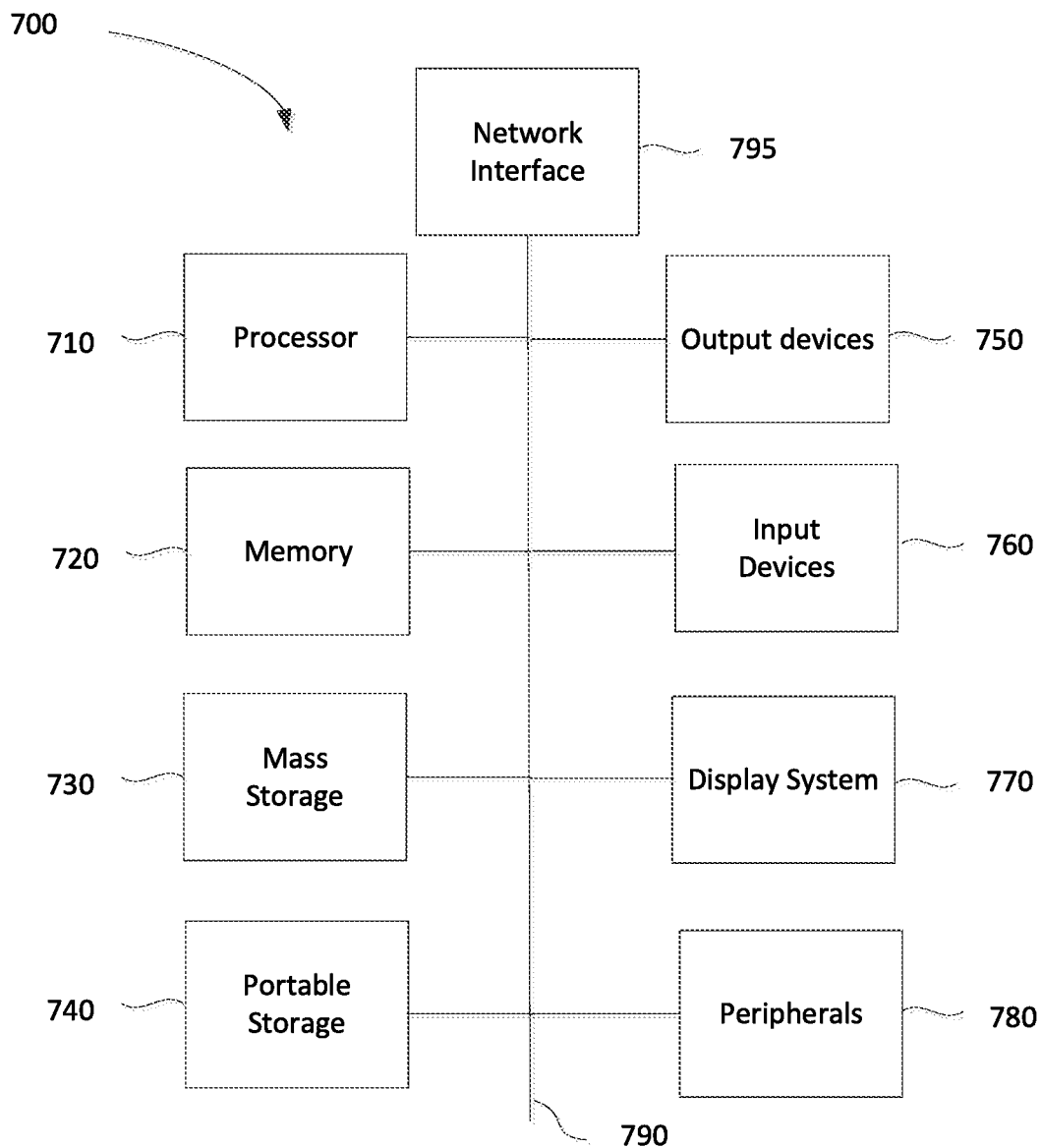
FIG. 7 illustrates a computing system that may be used to implement an embodiment of the present invention.

FIG. 7 illustrates a computing system that may be used to implement an embodiment of the present invention. The computing system 700 of FIG. 7 includes one or more processors 710 and main memory 720. Main memory 720 stores, in part, instructions and data for execution by processor 710. Main memory 720 can store the executable code when in operation. The system 700 of FIG. 7 further includes a mass storage device 730, portable storage medium drive(s) 740, output devices 750, user input devices 760, a graphics display 770, peripheral devices 780, and network interface 795.

The components shown in FIG. 7 are depicted as being connected via a single bus 790. However, the components may be connected through one or more data transport means. For example, processor unit 710 and main memory 720 may be connected via a local microprocessor bus, and the mass storage device 730, peripheral device(s) 780, portable storage device 740, and display system 770 may be connected via one or more input/output (I/O) buses.

Mass storage device 730, which may be implemented with a magnetic disk drive or an optical disk drive, is a non-volatile storage device for storing data and instructions for use by processor unit 710. Mass storage device 730 can store the system software for implementing embodiments of the present invention for purposes of loading that software into main memory 720.

Portable storage device 740 operates in conjunction with a portable non-volatile storage medium, such as a FLASH memory, compact disk or Digital video disc, to input and output data and code to and from the computer system 700 of FIG. 7. The system software for implementing embodiments of the present invention may be stored on such a portable medium and input to the computer system 700 via the portable storage device 740.

Input devices 760 provide a portion of a user interface. Input devices 760 may include an alpha-numeric keypad, such as a keyboard, for inputting alpha-numeric and other information, or a pointing device, such as a mouse, a trackball, stylus, or cursor direction keys. Additionally, the system 700 as shown in FIG. 7 includes output devices 750. Examples of suitable output devices include speakers, printers, network interfaces, and monitors.

Display system 770 may include a liquid crystal display (LCD), a plasma display, an organic light-emitting diode (OLED) display, an electronic ink display, a projector-based display, a holographic display, or another suitable display device. Display system 770 receives textual and graphical information, and processes the information for output to the display device. The display system 770 may include multiple-touch touchscreen input capabilities, such as capacitive touch detection, resistive touch detection, surface acoustic wave touch detection, or infrared touch detection. Such touchscreen input capabilities may or may not allow for variable pressure or force detection.

Peripherals 780 may include any type of computer support device to add additional functionality to the computer system. For example, peripheral device(s) 780 may include a modem or a router.

Network interface 795 may include any form of computer interface of a computer, whether that be a wired network or a wireless interface. As such, network interface 795 may be an Ethernet network interface, a BlueTooth™ wireless interface, an 802.11 interface, or a cellular phone interface.

The components contained in the computer system 700 of FIG. 7 are those typically found in computer systems that may be suitable for use with embodiments of the present invention and are intended to represent a broad category of such computer components that are well known in the art. Thus, the computer system 700 of FIG. 7 can be a personal computer, a hand held computing device, a telephone ("smart" or otherwise), a mobile computing device, a workstation, a server (on a server rack or otherwise), a minicomputer, a mainframe computer, a tablet computing device, a wearable device (such as a watch, a ring, a pair of glasses, or another type of jewelry/clothing/accessory), a video game console (portable or otherwise), an e-book reader, a media player device (portable or otherwise), a vehicle-based computer, some combination thereof, or any other computing device. The computer can also include different bus configurations, networked platforms, multi-processor platforms, etc. The computer system 700 may in some cases be a virtual computer system executed by another computer system. Various operating systems can be used including Unix, Linux, Windows, Macintosh OS, Palm OS, Android, iOS, and other suitable operating systems.

The present invention may be implemented in an application that may be operable using a variety of devices. Non-transitory computer-readable storage media refer to any medium or media that participate in providing instructions to a central processing unit (CPU) for execution. Such media can take many forms, including, but not limited to, non-volatile and volatile media such as optical or magnetic disks, solid state disks (SSD), and dynamic memory, respectively. Common forms of non-transitory computer-readable media include, for example, a FLASH memory, a flexible disk, a hard disk, magnetic tape, any other magnetic medium, a CD-ROM disk, digital video disk (DVD), any other optical medium, RAM, PROM, EPROM, a FLASHEPROM, and any other memory chip or cartridge.

While various flow diagrams provided and described above may show a particular order of operations performed by certain embodiments of the invention, it should be understood that such order is exemplary (e.g., alternative embodiments can perform the operations in a different order, combine certain operations, overlap certain operations, etc.).

Moreover, although the present disclosure and its advantages have been described in detail, without departing from the disclosure as defined by the appended claims. Moreover, the scope of the present application is not intended to be limited to the particular embodiments of the process, machine, manufacture, composition of matter, means, methods and steps described in the specification. As one will readily appreciate from the disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

The foregoing detailed description of the technology herein has been presented for purposes of illustration and description. It is not intended to be exhaustive or to limit the technology to the precise form disclosed. Many modifications and variations are possible in light of the above teaching. The described embodiments were chosen in order to best explain the principles of the technology and its practical application to thereby enable others skilled in the art to best utilize the technology in various embodiments and with various modifications as are suited to the particular use contemplated. It is intended that the scope of the technology be defined by the claim.

What is claimed is:

1. A method executable by a processor for minimizing latencies when performing a test, the method comprising:

sequentially generating, by a processor, a plurality of commands to send to a device under test (DUT);

sequentially sending, by the processor, each of the plurality of generated commands to the DUT;

storing, by the processor, command summary data for each of the commands sent to the DUT in a low latency buffer; and migrating, by the processor, at least a portion of the command summary data stored in the low latency buffer for storage in a persistent data storage device, the migration of the at least portion of the command summary data resulting in the portion of the command summary data to be stored in one or more logical blocks of the persistent data storage device.

2. The method of claim 1, further comprising:

Identifying, by the processor, a command type for each of the commands; and identifying, by the processor, a data pattern associated with each of the commands, wherein the command summary data stored in the buffer identifies the command type and the data pattern associated with each of the commands.

3. The method of claim 2, wherein the stored command summary data also includes timing information associated with each of the commands.

4. The method of claim 1, wherein:

the plurality of commands includes a write command, data included in the write command includes a data pattern identifier that identifies a pattern associated with the write command, and the data pattern identifier is stored in a first number of bytes of the buffer that are associated with the write command.

5. The method of claim 4, further comprising:

identifying, by the processor, that the data pattern identifier corresponds to a data pattern that includes a second number of bytes; and sending, by the processor, the second number of bytes to the DUT when the write command is sent to the DUT.

6. The method of claim 1, further comprising:

receiving, by the processor, read data from the DUT in response to a read command of the plurality of commands; and identifying, by the processor, that the read data received from the DUT corresponds to a data pattern identifier that corresponds to a data pattern of a set of data patterns, wherein the data pattern identifier is associated with a first number of bytes of the data buffer associated with the read command.

7. The method of claim 1, further comprising:

starting, by the processor, a timer when a first command of the plurality of commands are sent to the DTU;

identifying, by the processor, that the first command has been completed; and stopping, by the processor, the timer based on the identification that the first command has been completed.

8. A non-transitory computer-readable storage medium having embodied thereon a program executable by a processor for implementing a method for minimizing latencies performing a test, the method comprising:

sequentially generating a plurality of commands to send to a device under test (DUT);

sequentially sending each of the plurality of generated commands to the DUT;

storing command summary data for each of the commands sent to the DUT in a low latency buffer; and migrating at least a portion of the command summary data stored in the low latency buffer for storage in a persistent data storage device, the migration of the at least portion of the command summary data results in the portion of the command summary data to be stored in one or more logical blocks of the persistent data storage device.

9. The non-transitory computer-readable storage medium of claim 8, the program further executable to:

identify a command type for each of the commands; and identify a data pattern associated with each of the commands, wherein the command summary data stored in the buffer identifies the command type and the data pattern associated with each of the commands.

10. The non-transitory computer-readable storage medium of claim 9, wherein the stored command summary data also includes timing information associated with each of the commands.

11. The non-transitory computer-readable storage medium of claim 8, wherein:

the plurality of commands includes a write command, data included in the write command includes a data pattern identifier that identifies a pattern associated with the write command, and the data pattern identifier is stored in a first number of bytes of the buffer that are associated with the write command.

12. The non-transitory computer-readable storage medium of claim 8, the program further executable to:

identify that the data pattern identifier corresponds to a data pattern that includes a second number of bytes; and send the second number of bytes to the DUT when the write command is sent to the DUT.

13. The non-transitory computer-readable storage medium of claim 8, the program further executable to:

receive read data from the DUT in response to a read command of the plurality of commands; and identify that the read data received from the device corresponds to a data pattern identifier that corresponds to a data pattern of a set of data patterns, wherein the data pattern identifier is associated with a first number of bytes of the data buffer associated with the read command.

14. The non-transitory computer-readable storage medium of claim 8, the program further executable to:

start a timer when a first command of the plurality of commands are sent to the DUT;

identify that the first command has been completed; and stop the timer based on the identification that the first command has been completed.

15. An apparatus for minimizing latencies when performing a test, the apparatus comprising:

a low latency buffer that stores command summary data; and a controller that:

sequentially generates a plurality of commands to send to a device under test (DUT), sequentially sends each of the plurality of generated commands to the DUT, stores the command summary data for each of the commands sent to the DUT in the low latency buffer, and migrates at least a portion of the command summary data stored in the low latency buffer for storage in a persistent data storage device, the migration of the at least portion of the command summary data results in the portion of the command summary data to be stored in one or more logical blocks of the persistent data storage device.

16. The apparatus of claim 15, wherein the controller includes a processor that executes instructions out of a memory.

17. The apparatus of claim 15, wherein the controller includes digital logic that performs one or more functions of the controller.

18. The apparatus of claim 15, wherein:
the controller identifies a command type for each of the commands, and
the controller identifies a data pattern associated with each of the commands, and
the command summary data stored in the buffer identifies the command type and the data pattern associated with each of the commands.

19. The apparatus of claim 15, wherein the stored command summary data also includes timing information associated with each of the commands.

20. The apparatus of claim 15, wherein:
the plurality of commands includes a write command,
data included in the write command includes a data pattern identifier that identifies a pattern associated with the write command, and
the data pattern identifier is stored in a first number of bytes of the buffer that are associated with the write command.

* * * * *